(12) United States Patent
McKenzie et al.

(10) Patent No.: US 7,880,476 B1
(45) Date of Patent: Feb. 1, 2011

(54) METHOD TO AND APPARATUS FOR DETECTING AND LOCATING A FAULT IN AN ELECTRICAL CONDUCTOR WIRE

(76) Inventors: Fiona A. M. McKenzie, 4162 E. Brown Way, Tucson, AZ (US) 85711; Charles S. Richardson, 4162 E. Brown Way, Tucson, AZ (US) 85711

( * ) Notice: Subject to any disclaimer, the term of this patent is extended or adjusted under 35 U.S.C. 154(b) by 363 days.

(21) Appl. No.: 12/220,945

(22) Filed: Jul. 29, 2008

(51) Int. Cl.
G01R 31/02 (2006.01)
G01R 31/08 (2006.01)
G01R 31/28 (2006.01)

(52) U.S. Cl. ............... 324/543; 324/519; 324/520; 324/528; 324/530; 324/542

(58) Field of Classification Search ............ 324/512, 324/519, 520, 527, 528, 530, 539, 542, 543
See application file for complete search history.

(56) References Cited

U.S. PATENT DOCUMENTS

| | | | | |
|---|---|---|---|---|
| 3,991,363 A * | 11/1976 | Lathrop | ............... | 324/528 |
| 4,322,677 A * | 3/1982 | Wright | ............... | 324/531 |
| 4,896,117 A * | 1/1990 | Floweredew et al. | ............... | 324/520 |
| RE33,977 E * | 6/1992 | Goodman et al. | ............... | 73/40.5 A |
| 5,210,497 A * | 5/1993 | Regini | ............... | 324/520 |
| 6,411,073 B1 * | 6/2002 | Fischer et al. | ............... | 324/66 |
| 6,545,485 B1 * | 4/2003 | Sanderson | ............... | 324/520 |
| 6,646,447 B2 * | 11/2003 | Cern et al. | ............... | 324/539 |
| 6,867,596 B1 * | 3/2005 | Mizuno | ............... | 324/528 |
| 6,868,357 B2 * | 3/2005 | Furse | ............... | 324/642 |
| 7,439,747 B2 * | 10/2008 | Beeman | ............... | 324/528 |
| 7,586,308 B2 * | 9/2009 | Mercer et al. | ............... | 324/326 |
| 2006/0061368 A1 * | 3/2006 | Furse et al. | ............... | 324/519 |

OTHER PUBLICATIONS

Gluskin, E., A Nonlinear Resistor and Nonlinear Inductor Using a Nonlinear Capacitor, 1999, Journal of the Franklin Institute, 366, pp. 1035-1047.*

* cited by examiner

Primary Examiner—Timothy J Dole

(57) ABSTRACT

The present invention provides a new technique for solving the problem of detecting and locating soft faults, such as frays, in electrical conductor wires. This new technique utilizes the nonlinear ferroelectric capacitive properties of piezoelectric ceramic elements, such as PZT, in conjunction with an antenna coil, to realize a tuned antenna receiver circuit with significantly increased reception sensitivity. The present invention consists of a battery powered, hand-held transmitter, with an output terminal for physical connectors, and a battery powered, hand-held receiver. Soft faults are detected and accurately located, to within a half inch distance of the actual soft fault, as the receiver is passed along the path of the electrical conductor wire, by the operator, who determines a reduction or cessation of the visible and audible indicators. The ultrasonic frequency piezoelectric transducer also enables the receiver to be used as an ultrasonic frequency detector for detecting electrical arcing from powered transmission lines.

15 Claims, 3 Drawing Sheets

Figure 1:
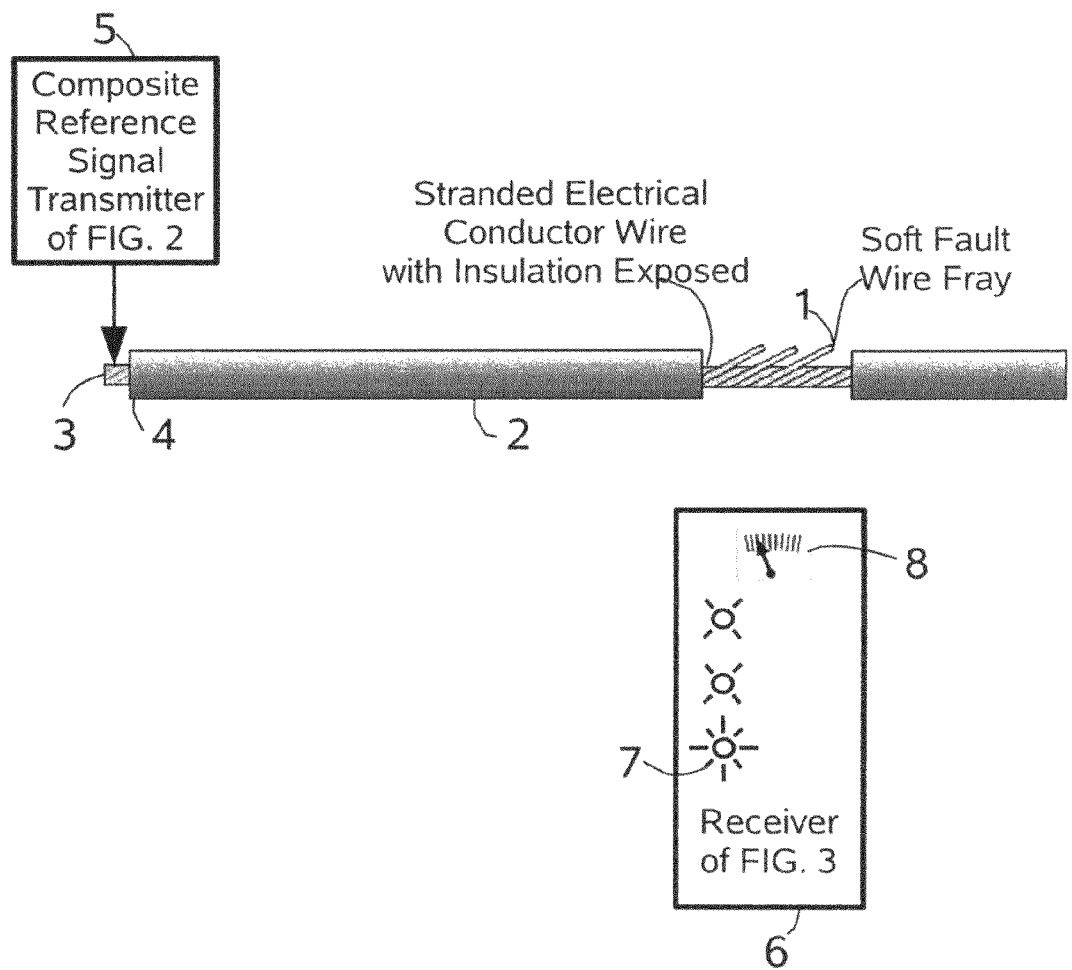

METHOD TO AND APPARATUS FOR DETECTING AND LOCATING A FAULT IN AN ELECTRICAL CONDUCTOR WIRE

BACKGROUND

This invention relates to electrical conductor wire tracing systems. In particular, this invention is concerned with the tracing of a composite reference signal along an electrical conductor wire and, by so doing, detect and accurately locate any existence of soft faults, such as frays, in the electrical conductor wire.

The NASA Wiring Working Group was initiated in to address the problem of wiring systems integrity and, in particular, the wire integrity problem as related to aged wiring systems. The NSTC Committee On Technology, Wire Systems Safety Interagency Working Group, consisting of NASA, F.A.A and the D.O.D., presented a Review of Federal Programs for Wire System Safety, dated November 2000. This Review acknowledged the fact that the wiring system problem extended far beyond the aviation industry and, in fact was a major concern throughout our society.

According to Eric van Doorn, Ph.D. and Devendra Tolani, Ph.D. of Intelligent Automation Inc., as stated in their paper entitled Radical Extension Of Time Domain Reflectometry For Detection And Location Of Flaws In Aircraft Wiring Systems, 2005, "However, there are currently no methods available that can reliably detect and localize soft faults, such as insulation damage, or frays."

Wire and cable tracers trace the presence of a reference signal along an electrical conductor wire in order to detect and locate opens and/or shorts in the conductor wire. Many wire tracers employ a variety of different frequency generation, modulation and transmission schemes to provide a traceable reference signal. The modulation schemes employed in these prior arts usually entail the modulation of a high frequency, usually in the upper audio range, by a lower modulating frequency. U.S. Pat. No. 3,991,363 makes use of such a modulation scheme by modulating a high frequency (100 KHz.) and a low frequency (11 Hz.) and transmitting the composite of these frequencies so as to have the higher frequency appear as a pulsed signal along the conductor cable and thus provide a traceable reference signal. U.S. Pat. No. 4,896,117 describes the benefits and drawbacks of transmitting and detecting such high and low frequency signals along a conductor cable. Prior art wire tracers can trace a composite reference signal along the conductor wire when the conductor wire is behind an interior wall or in a bundle of other conductor wires. The problem with these wire tracers is the lack of effectiveness when the conductor is enclosed in a denser material such as metal. One main problem with these prior art devices is the lack of sufficient sensitivity to receive the injected reference signal and thus precisely detect and locate a hard fault or a soft fault, such as frayed wires, in a conductor wire.

The current state of technology employed to address the problems associated with the detection and locating of hard and soft faults in electrical conductor wire include Time Domain Reflectometry, Frequency Domain Reflectometry and Standing Wave Reflectometry. TDR, one of the most widely used method, lacks the sensitivity to reliably and accurately locate soft faults. TDR, FDR and SWReflectometry testing equipment is expensive, bulky, requires a highly trained technician to perform the testing and is less than 100% effective in detecting and locating faults in conductor wire integrity. Furthermore, these Reflectometry technologies require a known baseline measurement, of the conductor to be tested, for the results to be accurate. Having the conductor's baseline measurement allows some of the TDR devices to be able to locate a hard fault in an electrical conductor's integrity to only within six inches of the actual hard fault.

Recognizing that prior arts, employing composite reference signal tracing, exist and also recognizing that prior arts in the detection and location of wiring faults exist, it is the aim of this invention to improve on such conductor wire tracing systems by utilizing the nonlinear tuned receiver antenna circuit to reliably detect and accurately locate a soft fault in an electrical conductor wiring systems. Emanuel Gluskin, in his paper, A Nonlinear Resistor And Nonlinear Inductor Using A Nonlinear Capacitor, dated July 1998, made mention of obtaining a nonlinear inductor through the use of a nonlinear capacitor. "It is noted, and considered with some details, that the use of such a capacitor in a simple switched-capacitive circuit which imitates a resistance enables a nonlinear frequency-controllable resistance to be obtained, and that the use of such a capacitor as a load for a gyrator circuit enables a nonlinear inductor to be obtained." Utilizing this invention's nonlinear tuned receiver antenna circuit significantly increases the reception of the generated reference signal and by so doing, provides a low cost, hand held tracing and fault location system solution to the current lack of methods to reliably detect and accurately locate a soft fault in an electrical conductor wire.

SUMMARY OF INVENTION

The present invention provides a method to and apparatus for detecting and accurately locating soft faults, such as frays, in an electrical conductor wire. This new technique utilizes the ferroelectric and capacitive properties of a PZT based piezoelectric ceramic transducer, to provide a nonlinear ferroelectric capacitor. This nonlinear ferroelectric capacitor is connected in parallel with an antenna coil, to provide a tuned receiver antenna circuit. The nonlinear characteristics of the ferroelectric capacitor enables significantly increased sensitivity of reception of a composite reference signal which is injected onto an electrical conductor wire. The present invention consists of a battery powered, hand-held transmitter, with a transmitter output terminal with physical connectors, and a battery powered, hand-held receiver. The transmitter generates an extremely low frequency (ELF) sinusoidal electrical carrier signal and an ultrasonic frequency sinusoidal electrical modulating signal. The transmitter further performs the amplitude modulation of said carrier signal by said modulating signal to generate an ELF amplitude modulated sinusoidal electrical composite reference signal. The transmitter also includes an adjustable final amplifier, the output of which is applied, via capacitive coupling, to the transmitter output terminal. The transmitter output terminal enables the electromagnetic propagation, of said composite reference signal, through the electrical conductor wire, to be tested, via direct physical connection. The presence of the electromagnetic frequency of said carrier signal enables propagation of said modulating signal component through solid obstructions, such as metal. The receiver's receiver stage enables reception of said modulating signal electromagnetic component of said composite reference signal by said tuned receiver antenna circuit. The receiver further includes three separate amplification stages to provide levels of amplification of received said modulating signal component. These levels of amplification are each indicated in multiple manners including visibly, by means of LEDs and/or analog panel meter reading, or audibly, by means of built-in piezoelectric buzzer. The operator determines the presence of a soft fault, such as a fray, by determining the reduction or cessation of the visible and/or audible amplification level indicators, as the receiver is passed evenly along said electrical conductor wire. Said amplification levels can then be adjusted to a minimum indication level for enabling accurate locating of soft faults in the integrity of said electrical conductor wire to within a half inch distance of the actual flaw. The reduction of said amplification level indicators is associated with an increased impedance to and a lessening of the said composite reference signal, which results from frayed wire strands in said electrical conductor wire. The cessation of said amplification level indicators is associated with a complete break in said electrical conductor wire.

Other modulation technologies, such as pulse width modulation and frequency modulation will also achieve similar detection and location capabilities and are not outside the scope of the present invention. Also, within the scope of the present invention, is an automated, real time monitoring system for a wiring harness and the like wherein the receiver's final amplification stage output is connected to the input of an off-the-shelf X-10 control unit. The ultrasonic piezoelectric transducer also enables the receiver to be used as an ultrasonic detector for detecting electrical arcing from powered transmission lines.

DESCRIPTION OF DIAGRAMS

FIG. 1 is a block diagram of one embodiment of the present invention, as it would be used by an operator to locate a soft fault, such as a fray, in an electrical wire.

Figure 2:
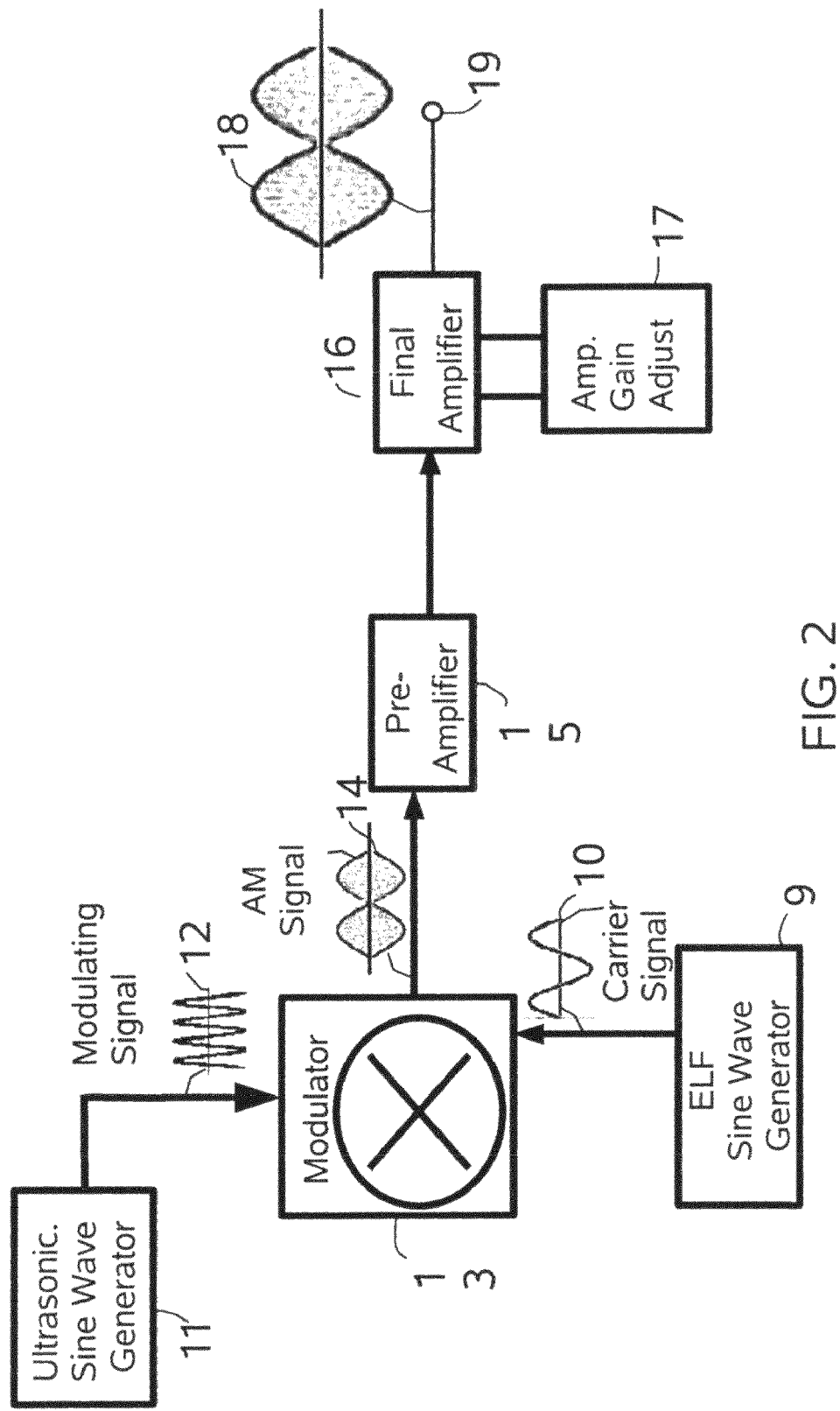

FIG. 2 is a transmitter, in block diagram form, of another embodiment of the present invention which includes a transmitter in which is generated a composite reference signal and which includes a preamplifier, an adjustable final amplifier, which is capacitively coupled to the transmitter output terminal for electromagnetic transmission of said composite reference signal through direct physical connection to an electrical conductor wire.

Figure 3:
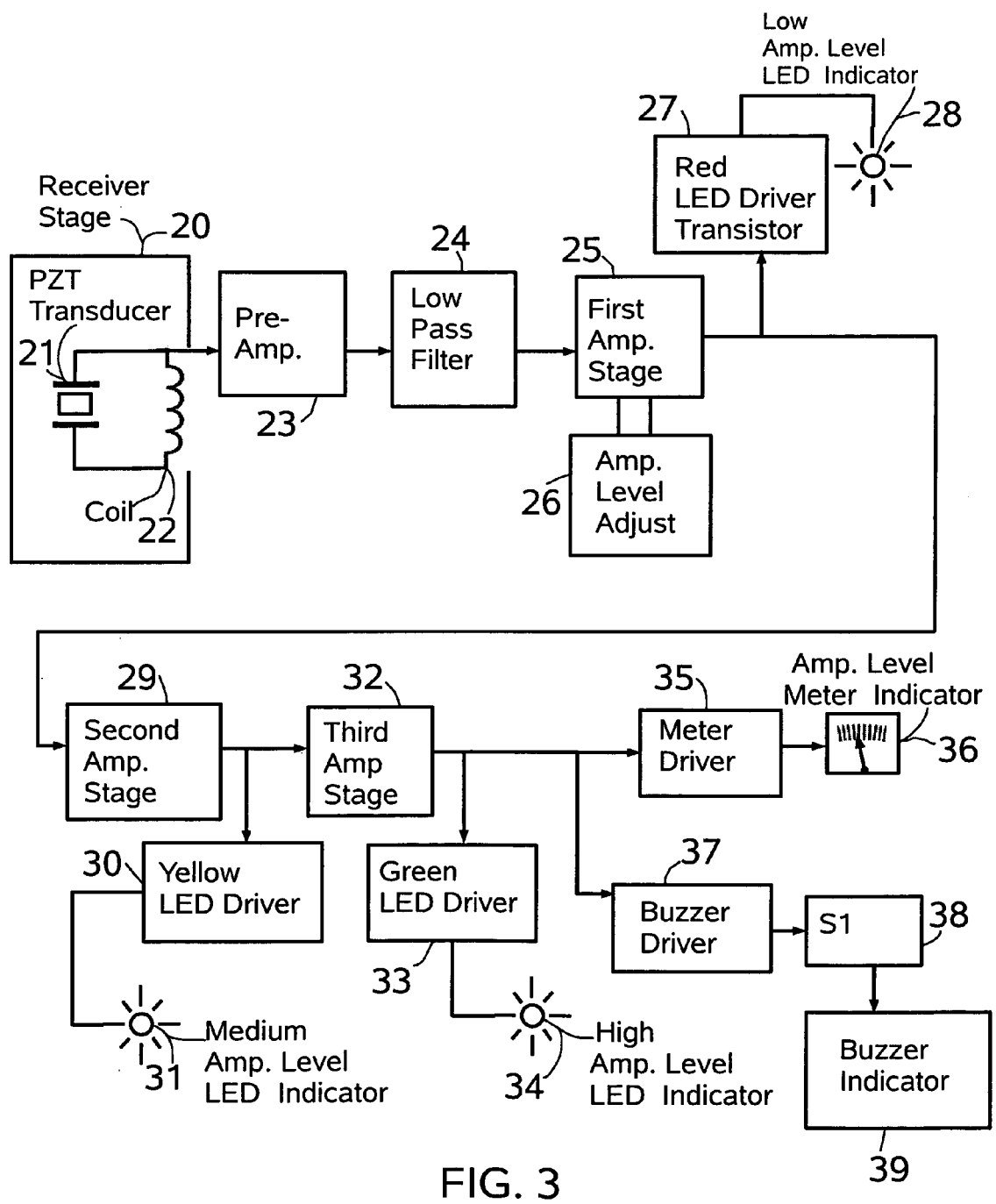

FIG. 3 is a receiver, in block diagram form, of another embodiment of the present invention which includes a receiver stage in which the piezoelectric ceramic transducer, in combination with a coil, receives, converts and amplifies the received electromagnetic composite reference signal and which includes indicators, both visible and audible, of the three levels of adjustable amplification provided.

DETAILED DESCRIPTION OF INVENTION

Referring now to FIG. 1, an embodiment of the present invention is shown as it would be used by an operator to locate a soft fault, such as a fray, in an electrical conductor wire. FIG. 1 shows a soft fault fray 1 in an electrical line 2, which is comprised of an electrical conductor wire 3 and the insulator coating 4. FIG. 1 further shows a transmitter 5, in which is generated an electrical composite reference signal for applying to the electrical line. The composite reference signal is comprised of an extremely low frequency (ELF) electrical carrier signal and an ultrasonic frequency electrical modulating signal, which are amplitude modulated to form an ELF amplitude modulated composite reference electrical signal. This composite reference electrical signal is amplified and applied, via capacitive coupling, to the amplifier output terminal, which is physically connected to the electrical line 2, so as to propagate along the length of the electrical line.

FIG. 1 also shows a receiver 6 having a reduced input signal, due to the soft fault fray reducing the strength of the propagated composite reference signal, and producing mid-level visible indications, via LEDs 7 and analog panel meter reading 8.

Referring now to FIG. 2, the transmitter is powered on by moving the power switch (not shown) to the On position, which connects the 9 volt battery (not shown) to the inputs of a DC-DC switching power supply (not shown). The switching power supply is configured to provide a +36 VDC power source and a −36 VDC power source. A +12 volt voltage regulator provides a +12 VDC power source from the +36 VDC power source, while a −12 volt voltage regulator provides a −12 VDC power source from the −36 VDC power source. An LED (not shown) is provided to indicate the power-on condition of the transmitter. An ELF sine wave generator 9 generates a 7 Hz. sinusoidal electrical carrier signal 10. An ultrasonic frequency sinusoidal electrical modulating signal 12, of 40 KHz., is generated by the ultrasonic frequency sine wave generator 11. A balanced modulator 13 is provided for the amplitude modulating of the carrier signal 10 by the modulating signal 12 to form an ELF amplitude modulated composite electrical signal 14. The transmitter low pass preamplifier 15 and final amplifier 16 amplify the composite electrical signal 14 to attain a 70 Vpeak-peak sinusoidal electrical composite reference signal 18. The output peak-to-peak voltage level of the composite reference signal 18 can be varied by the amplifier gain adjust 17, which varies the ohmic value of the final amplifier's gain resistor. The composite reference signal 18 is then output, through capacitive coupling, to the transmitter output terminal 19 which can then be physically connected to the electrical conductor wire (3 of FIG. 1) through, already practiced, direct connections methods, such as pin or clip type hardware. The electromagnetic composite reference signal 18 is applied to the electrical conductor wire (3 of FIG. 1) in such ways as to enable the electromagnetic composite reference signal 18 to radiate along the path of the electrical line (2 of FIG. 1), with sufficient strength so that the electromagnetic composite reference signal 18 may be detected.

Referring now to FIG. 3, the receiver is powered on by moving the power switch (not shown) to the On position. The receiver's receiver stage 20 is comprised of a PZT based ultrasonic transducer 21 and an antenna coil 22 which are connected in an electrically parallel configuration with a resonant frequency of 40 KHz. The 40 KHz. resonant frequency of the receiver stage 20 provides a tuned antenna circuit which allows the ultrasonic frequency electromagnetic signal component of the electromagnetic composite reference signal (18 of FIG. 2) to be converted, to an ultrasonic frequency sinusoidal electrical signal, and passed, through capacitive coupling, onto the low-pass preamplifier 23 of the receiver. The low-pass preamplifier 23 has a low-pass filter at 40 KHz and amplifies the converted ultrasonic frequency electrical signal. The amplified ultrasonic frequency electrical signal is further filtered by another low-pass filter 24 at 40 KHz before being inverted by the first amplifier stage 25. The first amplifier stage 25 is configured with amplifier gain adjust 26 consisting of a variable resister in series with a fixed resistor as the gain resistor. This amplifier gain adjust 26 enables an amplification level adjustment of the converted ultrasonic frequency sinusoidal electrical signal and determines the level of amplification of the second and third amplifier stages. The output of the first amplifier stage 25 is capacitively coupled to the second amplifier stage 29 and is also capacitively coupled to an LED driver 27, consisting of an NPN switching transistor, which provides a driver for first amplifier stage amplification level LED indicator 28. The first amplifier stage amplification level LED indicator 28 provides a visible indication of the level of amplification of the first amplifier stage 25. The first amplifier stage amplification level LED driver 27 is biased so as to conduct when an output signal from the first amplifier stage amplification amplifier 25 is sensed at its' base. This first amplifier stage amplification level LED indicator 28 indicates the low level of amplification of the first amplifier stage 25. The second amplifier stage 29 amplifies the output from the first amplifier stage 25 and outputs the amplified received composite reference signal, through capacitive coupling to the input of the third amplifier stage 32. This second amplifier stage amplified out is also capacitively coupled to an LED driver 30, consisting of an NPN switching transistor, which provides a driver for the second amplifier stage amplification level LED indicator 31. The second amplifier stage amplification level LED indicator 31 provides a visible indication of the level of amplification of the second amplifier stage 29. The second amplifier stage amplification level LED driver 30 is biased so as to conduct when an output signal from the second amplifier stage 29 is sensed at its' base. This second amplifier stage amplification level LED indicator 31 indicates the medium level of amplification of the second amplifier stage 29. The third amplifier stage 32 amplifies the output from the second amplifier stage 29. The output of the third amplifier stage 32 is capacitively coupled to an LED driver 33, consisting of an NPN switching transistor, which provides a driver for third amplifier stage amplification level LED indicator 34. The third amplifier stage amplification level LED indicator 34 provides a visible indication of the level of amplification of the third amplifier stage 32. The third amplifier stage amplification level LED driver 33 is biased so as to conduct when an output signal from the third amplifier stage 32 is sensed at its' base. This third amplifier stage amplification level LED indicator 31 indicates the high level of amplification of the third amplifier stage 32. The output of the third amplifier stage 32 is also capacitively coupled to analog panel meter driver 35, consisting of an NPN switching transistor, which provides a driver for third amplifier stage amplification level analog panel meter indicator 36. The output of the third amplifier stage 32 is also capacitively coupled to buzzer driver 37, consisting of an NPN switching transistor, which provides a driver for third stage amplification level piezoelectric buzzer indicator 39. The third amplifier stage amplification level piezoelectric buzzer indicator 39 provides an audible indicator of the level of amplification of the third amplifier stage 32. The third amplifier stage amplification level piezoelectric buzzer indicator 39 may be optionally enabled by switch S1 38, which is a SPST switch.

This new technique of combining a nonlinear ferroelectric capacitor, in the form of a PZT based ultrasonic transducer, in parallel with the antenna coil, to form a tuned receiver antenna circuit, provides significantly increased sensitivity in reception of the transmitted composite reference signal along the electrical conductor wire under test. The intrinsic impedance of an electrical conductor wire increase when strands of conductor wire break (fray). These frays cause some of the electromagnetic field energy to be reflected back to the source. This reflection results in an attenuated electromagnetic composite reference signal in the energized electrical conductor wire, which is received as the receiver is passed evenly along the line 2 by the operator. The operator determines the presence and the received strength of the composite reference signal, as the receiver is passed evenly along the line 2, by adjusting the level of amplification of the received composite reference signal, as set by the first amplifier stage gain adjust 26 and as indicated by the visible indicating LEDs and/or analog panel meter reading. Soft faults, such as frays in stranded conductor wire, are accurately located when the receiver's visible amplification level indicators are determined to lessen or cease.

STATEMENT REGARDING FEDERALLY SPONSORED RESEARCH OR DEVELOPMENT

Not Applicable

REFERENCE TO SEQUENCE LISTING

Not Applicable

What is claimed is:

1. A method for detecting and locating a fault in an electrical conductor wire, to be tested, comprising:
   generating an extremely low frequency (ELF) sinusoidal electrical carrier signal;
   generating an ultrasonic frequency sinusoidal electrical modulating signal, as to which reception is to be indicated;
   amplitude modulating said modulating signal onto said carrier signal to form a balanced ELF amplitude modulated sinusoidal electrical composite reference signal;
   amplifying said composite reference signal to an amplitude, which enables transmission of said amplified composite reference signal through a distance of said electrical conductor wire, and applying said amplified composite reference signal to a transmitter output terminal via capacitive coupling;
   transmitting said amplified, capacitively coupled composite reference signal through the electrical conductor wire, to be tested, via direct physical connection with said transmitter output terminal;
   receiving, by a receiver, an ultrasonic frequency sinusoidal electromagnetic signal component, of said transmitted composite reference signal, as said receiver is passed evenly along the length of said electrical conductor wire, said receiver comprising a PZT based ultrasonic frequency piezoelectric ceramic transducer, which is connected, in an electrically parallel configuration, with an antenna coil so as to form a tuned antenna circuit;
   converting said received ultrasonic frequency sinusoidal electromagnetic signal component to an ultrasonic frequency sinusoidal electrical signal;
   amplifying said converted ultrasonic frequency sinusoidal electrical signal in multiple amplifier stages, with the first amplifier stage having an adjustable gain;
   indicating, visibly via LEDs, the level of amplification of said amplified converted signal, as determined by said adjustable gain of said first amplifier stage;
   indicating, visibly via analog panel meter reading, of the level of amplification of said amplified converted signal, as determined by said adjustable gain of said first amplifier stage;
   indicating, audibly via built-in piezoelectric buzzer, of the level of amplification of said amplified converted signal, as determined by said adjustable gain of said first amplifier stage;
   setting the level of amplification, by said operator, who varies said adjustable gain of said first amplifier stage, to a level, which is determined by said operator, where said indications increase when said receiver is held near said electrical conductor wire and said indications decrease as said receiver is moved away from said electrical conductor wire; and
   determining the location of a fault, by said operator, who determines a sudden reduction or cessation of so set said indicators, as said receiver is passed evenly along the length of said electrical conductor wire.

2. An apparatus for detecting and locating a fault in an electrical conductor wire, to be tested, comprising:
first generating means for generating an ELF sinusoidal electrical carrier signal;
second generating means for generating an ultrasonic frequency sinusoidal electrical modulating signal;
amplitude modulating means for amplitude modulating said modulating signal onto said carrier signal to form a balanced ELF amplitude modulated sinusoidal electrical composite reference signal;
first amplifier means for amplifying said composite reference signal to such an amplitude which enables transmission of said composite reference signal through a distance of said electrical conductor wire and said composite reference signal, now amplified, is applied, via capacitive coupling, to a transmitter output terminal;
transmission means for transmitting said amplified composite reference signal, from said first amplifier means, through said electrical conductor wire, via direct physical connection;
receiving means for receiving an ultrasonic frequency sinusoidal electromagnetic signal component, from said transmission means, as a receiver is passed evenly along said electrical conductor wire, said receiver comprising a PZT based ultrasonic frequency piezoelectric ceramic transducer, which is connected, in an electrically parallel configuration, with an antenna coil so as to form a tuned antenna circuit, for enabling reception of the ultrasonic frequency sinusoidal electromagnetic signal component from said transmission means and for enabling converting means;
converting means for converting said signal component from said receiver means to an ultrasonic frequency sinusoidal electrical signal;
second amplifier means for amplifying said electrical signal from said converting means in multiple amplifier stages, so as to provide levels of amplification, with the first amplifier stage having an adjustable gain;
first indicator means for indicating, visibly via differently colored LEDs, the level of amplification of said second amplifier means, as determined by said adjustable gain of said first amplifier stage;
second indicator means for indicating, visibly via analog panel meter reading, the level of amplification of said second amplifier means, as determined by said adjustable gain of said first amplifier stage; and
third indicator means for indicating, audibly via built-in piezoelectric buzzer, the level of amplification of said second amplifier means, as determined by said adjustable gain of said first amplifier stage.

3. An apparatus as claimed in claim 2, wherein a transmitter comprises the first generating means, the second generating means, and the amplitude modulating means.

4. An apparatus as claimed in claim 3, wherein the transmitter also includes an adjustable amplification stage for enabling said transmission means, via capacitive coupling.

5. An apparatus as claimed in claim 4, where said adjustable amplification stage is capacitively coupled to the transmitter output terminal for enabling said transmission means, through direct physical connection with said electrical conductor wire.

6. An apparatus as claimed in claim 2, wherein said receiving means further includes a preamplifier stage for enabling said second amplifier means.

7. An apparatus as claimed in claim 2, wherein said second amplifier means comprise: a first amplifier stage, having an adjustable gain; a second amplifier stage; and a third amplifier stage, for enabling the first, second and third indicator means.

8. An apparatus as claimed in claim 7, wherein the first amplifier stage further includes a transistor based LED driver circuit connected to a colored LED for enabling low amplification level visible indication.

9. An apparatus as claimed in claim 7, wherein the second amplifier stage includes a transistor based LED driver circuit connected to a separate different colored LED for enabling intermediate amplification level visible indication.

10. An apparatus as claimed in claim 7, wherein the third amplifier stage includes a transistor based LED driver circuit connected to another separate different colored LED for enabling high amplification level visible indication.

11. An apparatus as claimed in claim 7 where the third amplifier stage further includes a transistor based meter driver circuit connected to the analog panel meter for enabling received signal strength visible indication.

12. An apparatus as claimed in claim 7 where the third amplifier stage further includes a transistor based driver circuit connected to the piezoelectric buzzer for enabling audible indication.

13. An apparatus as claimed in claim 2 wherein first indicator means consist of differently colored light emitting diodes for visibly indicating the levels of amplification of said second amplifier means.

14. An apparatus as claimed in claim 2 wherein second indicator means consist of an analog panel meter for visibly indicating the levels of amplification of said second amplifier means.

15. An apparatus as claimed in claim 2 wherein third indicator means consist of a piezoelectric buzzer for audibly indicating the levels of amplification of said second amplifier means.

* * * * *